United States Patent [19]
Abraham

[11] Patent Number: 6,087,266
[45] Date of Patent: Jul. 11, 2000

[54] METHODS AND APPARATUS FOR IMPROVING MICROLOADING WHILE ETCHING A SUBSTRATE

[75] Inventor: Susan C. Abraham, San Jose, Calif.

[73] Assignee: Lam Research Corporation, Fremont, Calif.

[21] Appl. No.: 08/883,860

[22] Filed: Jun. 27, 1997

[51] Int. Cl.[7] .............................................. H01L 21/3213
[52] U.S. Cl. .............................................. 438/714; 216/67
[58] Field of Search ................................. 438/714; 216/67

[56]         References Cited

U.S. PATENT DOCUMENTS

| | | | |
|---|---|---|---|
| 4,267,012 | 5/1981 | Pierce et al. | 156/643 |
| 4,740,485 | 4/1988 | Sharpe-Geisler | 437/246 |
| 4,878,994 | 11/1989 | Jucka et al. | 156/643 |
| 4,980,018 | 12/1990 | Mu et al. | 156/643 |
| 5,256,245 | 10/1993 | Keller et al. | 156/643 |

(List continued on next page.)

FOREIGN PATENT DOCUMENTS

| | | | |
|---|---|---|---|
| 489 407 A2 | 6/1992 | European Pat. Off. | H01L 37/32 |
| 622 477 A1 | 11/1994 | European Pat. Off. | C23F 4/00 |
| 0 702 391 A2 | 3/1996 | European Pat. Off. . | |
| 0 788 147 A2 | 8/1997 | European Pat. Off. . | |
| 3842758 | 6/1990 | Germany | H01L 21/90 |

OTHER PUBLICATIONS

Carter et al., "Transformer Coupled Plasma Etch Technology for the Fabrication of Subhalf Micron Structures," Jul. 1, 1993, Journal of Vacuum Science & Technology: Part A, vol. 11, No.4, Part 1, pp. 1301–1306.

"Notification of Transmittal of the International Search Report," Oct. 16, 1998, European Patent Office.

"International Search Report," Oct. 16, 1998, European Patent Office.

Riley, P; Holbert, R; Kavari, R; and Lujan, L., "Composite metal etching for submicron integrated circuits" Extented Abstracts, vol. 93, No. 1, May 1993, Princeton, NJ.

Riley, P; Peng, S; and Fang, L., "Plasma Etching of Aluminum for ULSI Circuits", Solid State Technology, vol. 36, No. 2, Feb. 1993, Washington.

Gottscho, R.S; Jurgensen, C.W; Vitkavage, D.J., "Microscopic Uniformity in Plasma Etching", Journal of Vacuum Science and Technology B, Microelectronic Process and Phenomomena, vol. 10, No. 5, Oct. 1992, pp. 2133–2147.

Patent Abstracts of Japan, vol. 95, No. 6, Jul. 31, 1995.

T.H. Ahn; S.W. Nam; K.J. Min; and Chung, C., "Effect of Residual Gases on Residue Formation during Tungsten/TiN/Ti Etching Using $SF_6$ and $Cl_2$ Gas Chemistry," Jpn. J. Appl. Phys. vol. 33 (1994) pp. L918–L920, Part 2, No. 7A, Jul. 1, 1994.

Primary Examiner—Randy Gulakowski
Assistant Examiner—Shamim Ahmed
Attorney, Agent, or Firm—Beyer Weaver & Thomas, LLP.

[57]              ABSTRACT

A method for improving microloading of a substrate to be etched in a plasma processing chamber. The substrate is etched with a first etchant to form trenches having a given trench width. The plasma processing chamber has a first power supply configured to energize a first electrode of the chamber and a second power supply configured to energize a second electrode of the chamber. The method includes obtaining a first data set among a plurality of data sets correlating power ratios of the first power supply and the second power supply with microloading percentages for the first etchant for different trench widths. The first data set correlates the power ratios with the microloading percentages for a first trench width. The first trench width approximates the given trench width as closely as possible. The method also includes extrapolating a second data set from the first data set. The second data set correlates the power ratios with the microloading percentages for the given trench width. There is also included ascertaining a power ratio of the power ratios of the second data set that yields a desired level of microloading. Additionally, there is included setting a first setting of one of the first power supply and the second power supply in accordance with the power ratio to achieve the desired level of microloading.

20 Claims, 5 Drawing Sheets

U.S. PATENT DOCUMENTS

| | | | |
|---|---|---|---|
| 5,320,707 | 6/1994 | Kanekiyo et al. | 156/665 |
| 5,326,427 | 7/1994 | Jerbic | 156/643 |
| 5,356,478 | 10/1994 | Chen et al. | 134/1 |
| 5,411,631 | 5/1995 | Hori et al. | 216/72 |
| 5,429,070 | 7/1995 | Campbell et al. | 118/723 |
| 5,496,762 | 3/1996 | Sandhu et al. | 437/60 |
| 5,522,520 | 6/1996 | Kawamoto | 216/62 |
| 5,540,812 | 7/1996 | Kadomura | 156/652.1 |
| 5,545,289 | 8/1996 | Chen et al. | 156/643.1 |
| 5,562,801 | 10/1996 | Nulty | 156/643.1 |
| 5,609,775 | 3/1997 | Liu | 216/77 |
| 5,620,615 | 4/1997 | Keller | 438/720 |
| 5,779,926 | 7/1998 | Ma et al. | 216/67 |
| 5,883,007 | 3/1999 | Abraham et al. | 438/714 |
| 5,904,862 | 5/1999 | Alterio et al. | 216/72 |
| 6,017,825 | 1/2000 | Kim et al. | 438/720 |

METHODS AND APPARATUS FOR IMPROVING MICROLOADING WHILE ETCHING A SUBSTRATE

BACKGROUND OF THE INVENTION

The present invention relates to the processing of semiconductor substrates. More particularly, the present invention relates to methods and apparatus for improving microloading while etching through a substrate's layer stack, including the metallization layer.

In semiconductor processing, devices such as component transistors may be formed on a semiconductor wafer or substrate, which is typically made of silicon. Metallic interconnect lines, which are typically etched from a metallization layer disposed above the substrate, may then be employed to couple the devices together to form the desired circuit.

To facilitate discussion, FIG. 1 illustrates a cross-section view of a layer stack 20, representing some of the layers formed during the fabrication of a typical semiconductor integrated circuit. Although a semiconductor integrated circuit (IC) is discussed herein to facilitate ease of understanding, the discussion herein also pertains to substrates employed to fabricate other electronic components, e.g., flat panel displays. It should be noted that other additional layers above, below, or between the layers shown may be present. Further, not all of the shown layers need necessarily be present and some or all may be substituted by other different layers.

At the bottom of layer stack 20, there is shown a substrate 100. An oxide layer 102, typically comprising $SiO_2$, may be formed above substrate 100. A barrier layer 104, typically formed of a titanium-containing layer such as Ti, TiW, TiN or other suitable barrier materials, may be disposed between oxide layer 102 and a subsequently deposited metallization layer 106. Barrier layer 104, when provided, functions to prevent the diffusion of silicon atoms from oxide layer 102 into the metallization layer.

Metallization layer 106 typically comprises copper, aluminum or one of the known aluminum alloys such as Al-Cu, Al-Si or Al-Cu-Si. When a layer contains aluminum or one of its alloys, that layer is referred to herein as the aluminum-containing layer. The remaining two layers of FIG. 1, i.e., an anti-reflective coating (ARC) layer 108 and an overlying photoresist (PR) layer 110, may then be formed atop metallization layer 106. The ARC layer 108, typically comprising another titanium-containing layer such as TiN or TiW, may help prevent light (e.g., from the lithography step that patterns the photoresist) from being reflected and scattered off the surface of the metallization layer 106 and may, in some cases, inhibit hillock growth.

Photoresist layer 110 represents a layer of conventional photoresist material, which may be patterned for etching, e.g., through exposure to ultra-violet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect fines, a portion of the layers of the layer stack, including the metallization layer, e.g., metallization layer 106, may be etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using an appropriate etchant, the areas of the metallization layer that are unprotected by the mask may then be etched away using an appropriate etching source gas, leaving behind metallization interconnect lines or features.

To achieve greater circuit density, modern IC circuits are scaled with increasingly narrower etch geometries. As a result, the feature sizes, i.e., the width of the interconnect lines or the spacings (e.g., trenches) between adjacent interconnect lines, have steadily decreased. By way of example, while a line width of approximately 0.8 microns ($\mu$m) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve even etch rates in different regions of the substrate. For example, the etch rate in the narrow spacings may different than that in the wider, open field regions. This phenomena, referred to herein as microloading, represents a significant challenge for process engineers. To elaborate, FIG. 2 illustrates a portion of layer stack 20 in which natural (or positive) microloading is observed. In layer stack 20, the etch rate through the narrow region 202(a) is slower than that of the open field region 204(a). Accordingly, the etch depth c in narrow region 204(a) is shallower than the etch depth b in open field region 204(a).

FIG. 3 illustrates the situation wherein reverse microloading is observed. Reverse microloading refers to the situation wherein the etch rate in the open field region 204(b) is slower than that in the narrow trench region 202(b). Accordingly, the etch depth b in open field region 204(b) is shallower than the etch depth c of narrow trench region 202(b). Mathematically speaking, the type and severity of microloading may be expressed as a microloading percentage calculated by the expression [(b–c)/b * 100] wherein b and c are the etch depths in the open field region and the narrow trench region respectively. If the microloading percentage is positive, the microloading is said to be natural (or positive). Conversely, if the microloading percentage is negative, the microloading is said to be reversed. In general, the larger the magnitude of the microloading percentage, the more severe the microloading problem.

Natural (or positive) microloading may be caused by many factors, e.g., inappropriate parameter settings, improper etch chemistries, narrow trench widths, and the like. It is observed that all things being equal, natural microloading tends to become more severe when trench widths fall below about 0.5microns, and especially when trench widths fall below about 0.35 microns. As a result of the etch rate variations associated with natural microloading, by the time metal etching is completed in areas having a slow etch rate (e.g., in the narrower spacings), overetching, i.e., the undue and inadvertent removal of materials from underlying layers, may already occur in areas having a higher etch rate (e.g., the open field regions).

In the past, process engineers respond to the presence of microloading by varying the etch parameters in a trial-and-error fashion until an acceptable level of microloading is achieved. By way of example, a process engineer may employ a large number of sample wafers to try out different etch pressures, increase or decrease the power settings, modify the etch chemistries, and/or the like, until one of the sample wafers meets the acceptable microloading threshold.

As mentioned, however, the prior art process of remedying microloading is mostly by trial and error.

Although the prior art technique of addressing the microloading problem may eventually result in a set of process parameters that yields an acceptable level of microloading, there are significant disadvantages. For example, the trial-and-error approach necessarily involves a large number of attempts, which are costly both in terms of time and money. For some etchants/etch geometries combinations, it may not be possible to ever reach the satisfactory level of microloading irrespective of the settings of other process parameters. However, the process engineers may not necessarily have this knowledge until a large number of combinations have been attempted, which costs time and money.

Further, the process window may be limited with respect to certain process parameters, and it may not be possible to achieve a satisfactory level of microloading even if the highest parameter setting is employed. By way of example, the power supplies in most plasma processing systems have a finite range. A process engineer may find, after many trials and errors, that a satisfactory level of microloading is not possible even if he employs the highest power level available. However, the prior art trial-and-error approach makes it virtually impossible for a process engineer to find out these limitations unless a number of trial etches are first performed.

In view of the foregoing, there are desired improved techniques that permit process engineers to address the microloading issue in a cost-efficient and time-saving manner.

SUMMARY OF THE INVENTION

The invention relates, in one embodiment, to a method for improving microloading of a substrate to be etched in a plasma processing chamber. The substrate is etched with a first etchant to form trenches having a given trench width. The plasma processing chamber has a first power supply configured to energize a first electrode of the chamber and a second power supply configured to energize a second electrode of the chamber. The method includes obtaining a first data set among a plurality of data sets correlating power ratios of the first power supply and the second power supply with microloading percentages for the first etchant for different trench widths. The first data set correlates the power ratios with the microloading percentages for a first trench width. The first trench width approximates the given trench width as closely as possible.

The method further includes ascertaining a power ratio of the power ratios of the first data set that yields a desired level of microloading. If the power ratio does not exist in the first data set, the method includes employing a second etchant different from the first etchant to etch the substrate. The second etchant has a greater inhibiting characteristic than the first etchant. If the power ratio is in the first data set, the method also includes setting a first setting of a first one of the first power supply and the second power supply in accordance with the power ratio to achieve the desired level of microloading in etching the substrate with the first etchant.

In another embodiment, the invention relates to a method for improving microloading of a substrate to be etched in a plasma processing chamber. The substrate is etched with a first etchant to form trenches having a given trench width. The plasma processing chamber has a first power supply configured to energize a first electrode of the chamber and a second power supply configured to energize a second electrode of the chamber. The method includes obtaining a first data set among a plurality of data sets correlating power ratios of the first power supply and the second power supply with microloading percentages for the first etchant for different trench widths. The first data set correlates the power ratios with the microloading percentages for a first trench width. The first trench width approximates the given trench width as closely as possible.

The method also includes extrapolating a second data set from the first data set. The second data set correlates the power ratios with the microloading percentages for the given trench width. There is also included ascertaining a power ratio of the power ratios of the second data set that yields a desired level of microloading. Additionally, there is included setting a first setting of one of the first power supply and the second power supply in accordance with the power ratio to achieve the desired level of microloading.

These and other advantages of the present invention will become apparent upon reading the following detailed descriptions and studying the various figures of the drawings.

DETAILED DESCRIPTION OF THE PREFERRED EMBODIMENTS

Figure 1:
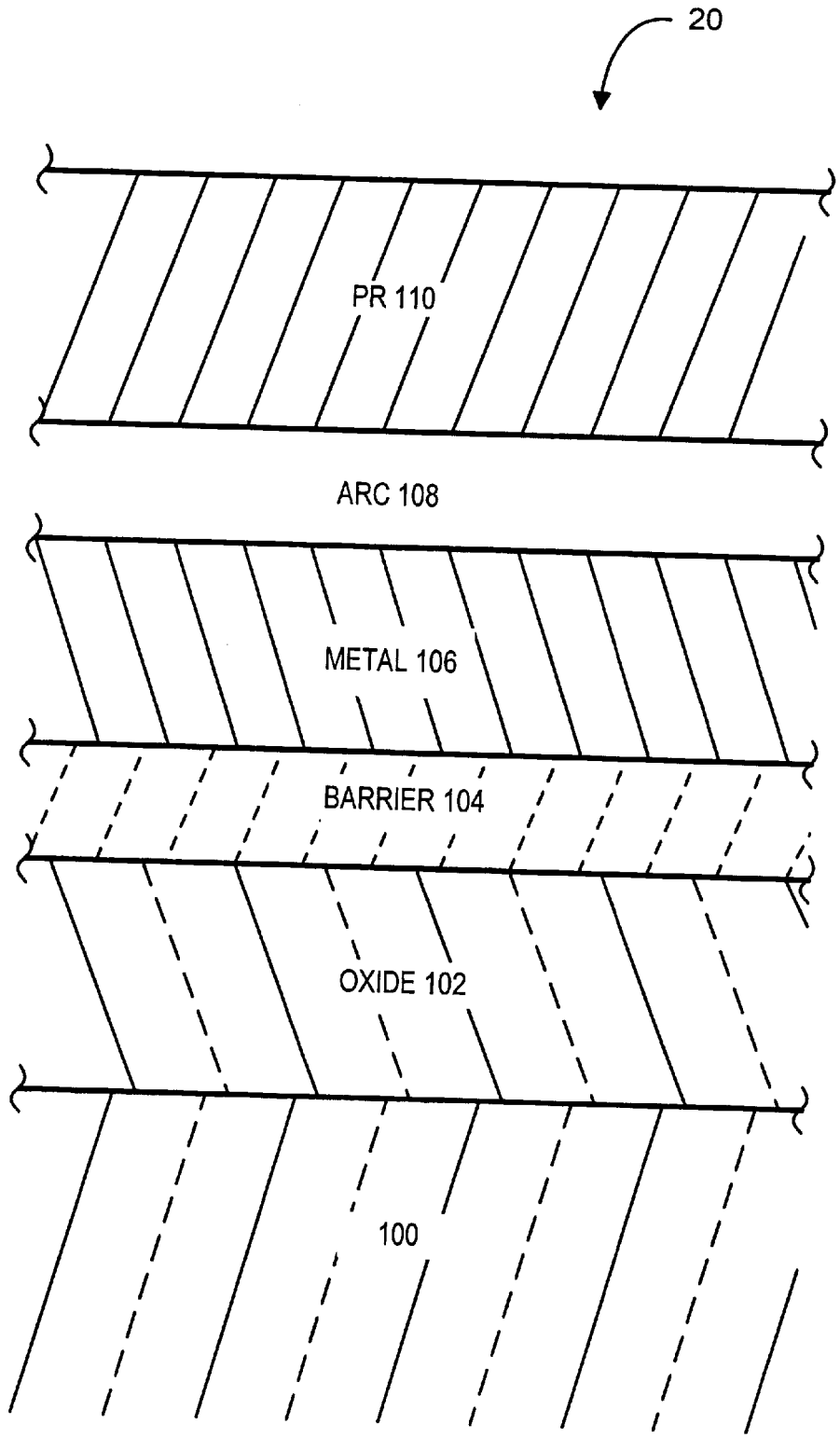
FIG. 1 illustrates a cross-section view of a layer stack, representing the layers formed during the fabrication of a typical semiconductor IC.
Figure 2:
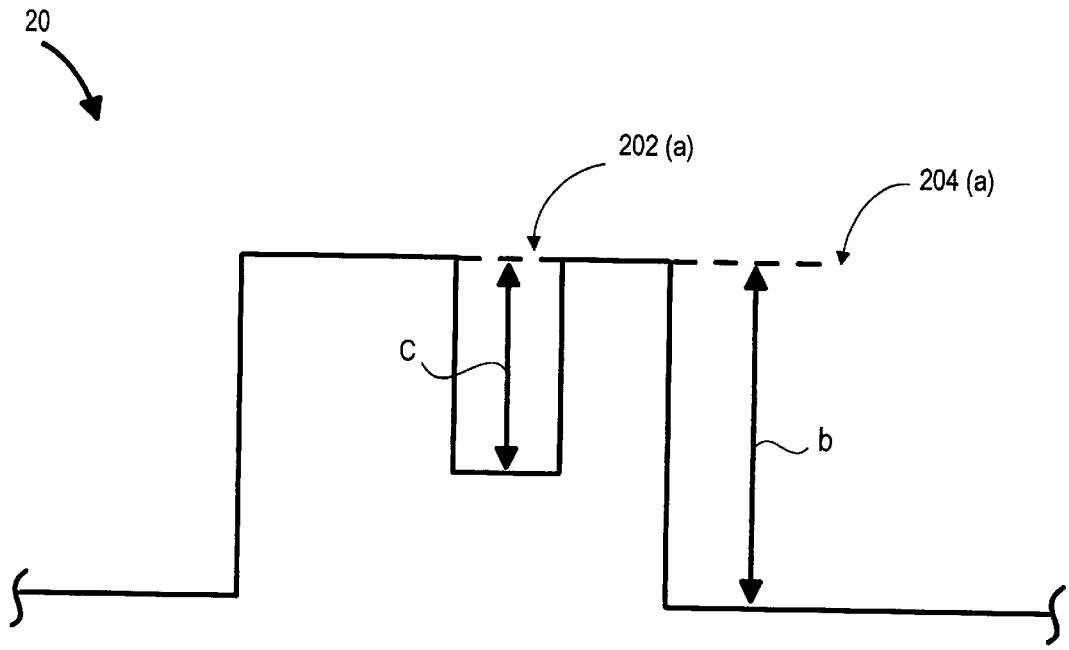
FIG. 2 illustrates a cross-section view of the layer stack of FIG. 1 which suffers from natural (positive) microloading.
Figure 3:
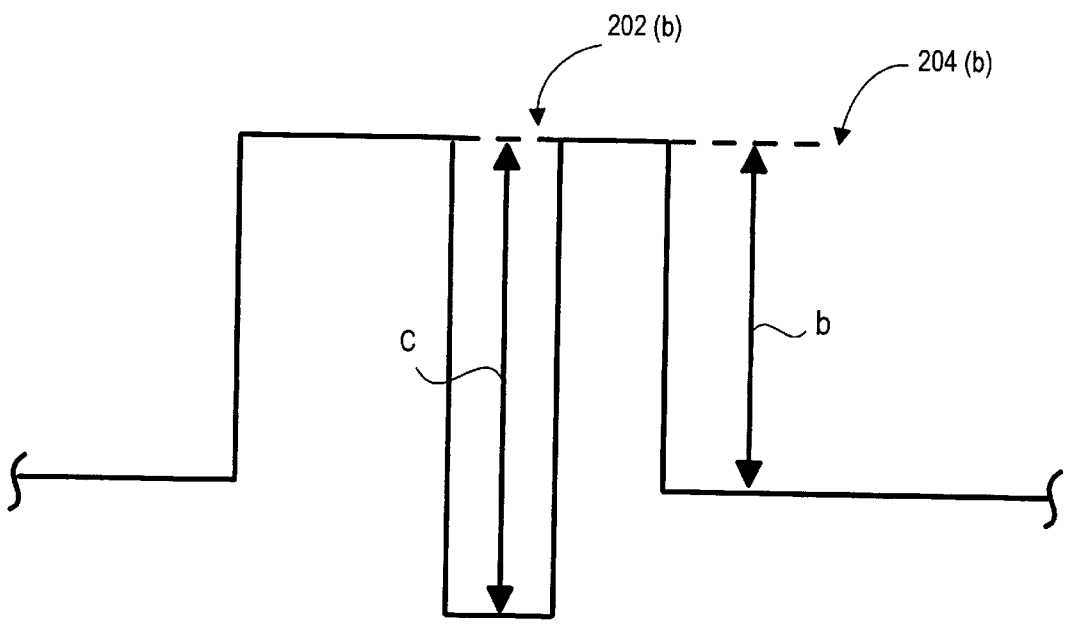
FIG. 3 illustrates a cross-section view of the layer stack of FIG. 1 which suffers from reverse (negative) microloading.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention relates, in one embodiment, to novel and nonobvious techniques for alleviating the microloading problem experienced by process engineers in etching substrates in a plasma processing chamber. In accordance with one aspect of the invention, it has been discovered that the microloading characteristics of a substrate can be controlled by simply modifying the power ratio between the top power and the bottom power settings of a plasma processing system. In other words, it has been discovered that varying the power ratio, instead of the amount of total power (i.e., the sum of the bottom power and top power), influences the microloading percentage and the type of microloading (e.g., from natural microloading to reverse microloading or vice versa) in particularly advantageous ways. For example, the power ratio may be varied to achieve the desired microloading level without introducing substrate damage and selectivity issues typically encountered when the total power is increased. This aspect of the invention is particularly advantageous since too much power may unduly degrade etch performance (e.g., reduce the selectivity to photoresist due to an enhanced level of bombardment, increase the possibility of substrate defect due to higher ion densities, and/or the like).

With this discovery, the invention pertains, in one embodiment, to the use of pre-determined data sets that correlate power ratios, microloading percentages, and etch geometries to enable the process engineer to quickly and more accurately achieve the desired microloading level for a certain substrate etched with a particular chemistry. In accordance with one embodiment of the inventive technique, microloading may be addressed, in a nonobvious manner, by simply ascertaining the appropriate power ratio suggested by the predefined data sets for a particular etch geometries/etchant combination and then varying the top and bottom power levels to achieve that suggested power ratio. Advantageously, the need to perform trial etches are obviated, thereby eliminating the costs (in terms of time and money) associated therewith.

If desired, the top and bottom power levels may be constrained to prevent the total power from exceeding a threshold which may cause undue substrate damage or selectivity degradation. Thus this approach is significantly different from and advantageous over the prior art trial-and-error approach in that it provides a quick and clearly defined methodology for microloading improvement. By employing the predetermined data sets in combination with the techniques disclosed herein, the process engineer may substantially eliminate the time-consuming trial-and-error etches of the prior art when trying to achieve the acceptable level of microloading.

If it turns out, upon inspecting the data set for a current etch geometries/etchant combination, that it is not possible to achieve the desired level of microloading at any permissible power ratio, the process engineer may then immediately employ, in accordance with another aspect of the invention, other etchants that may have a different level of inhibiting characteristic to achieve the acceptable microloading percentage. Again, this is achieved without requiring the process engineer to perform multiple trial etches, thereby eliminating the costs (in terms of time and money) associated therewith. Once the appropriate etchant is ascertained, the technique can be iteratively applied to this new etchant to fine tune the power ratio in order to allow the process engineer, as a fine adjustment, to arrive at the appropriate power ratio for the new etchant to achieved the desired microloading performance.

The inventive microloading improvement technique may be performed in connection with any of the known plasma processing apparatuses, including those adapted for dry etching, plasma etching, reactive ion etching (RIE), magnetically enhanced reactive ion etching (MERIE), or the like. To further elaborate, in a typical plasma processing chamber adapted for dry etching, the substrate is treated with plasma. The chamber includes an inlet port through which process etchant source gases are supplied to the chamber interior. A suitable RF energy source, e.g., an RF energy source, is applied to electrodes associated with the chamber to induce plasma. The energy itself may be coupled inductively or capacitively to sustain the plasma, as is known. Species are then formed from the etchant source gas to react with the substrate and etch away at the plasma-contacting layer of the substrate layer stack. The by-products, which may be volatile, are then exhausted through an exit port.

Plasma etching relates to the situation where the substrate is positioned on the anode, or ground electrode during substrate processing. On the other hand, reactive ion etching (RIE) relates to the situation where the substrate is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective whether energy to the plasma is delivered through capacitively coupled parallel electrode plates, through electron cyclotron resonance (ECR) microwave plasma sources, through inductively coupled RF sources such as helicon, helical resonators, and transformer coupled plasma (irrespective whether the coil is planar or nonplanar and whether it is disposed outside of the chamber or within the chamber and insulated therefrom by a dielectric jacket). Electron cyclotron resonance and transformer coupled plasma processing systems, among others, are available from Lam Research Corporation of Fremont, Calif.

Figure 4:
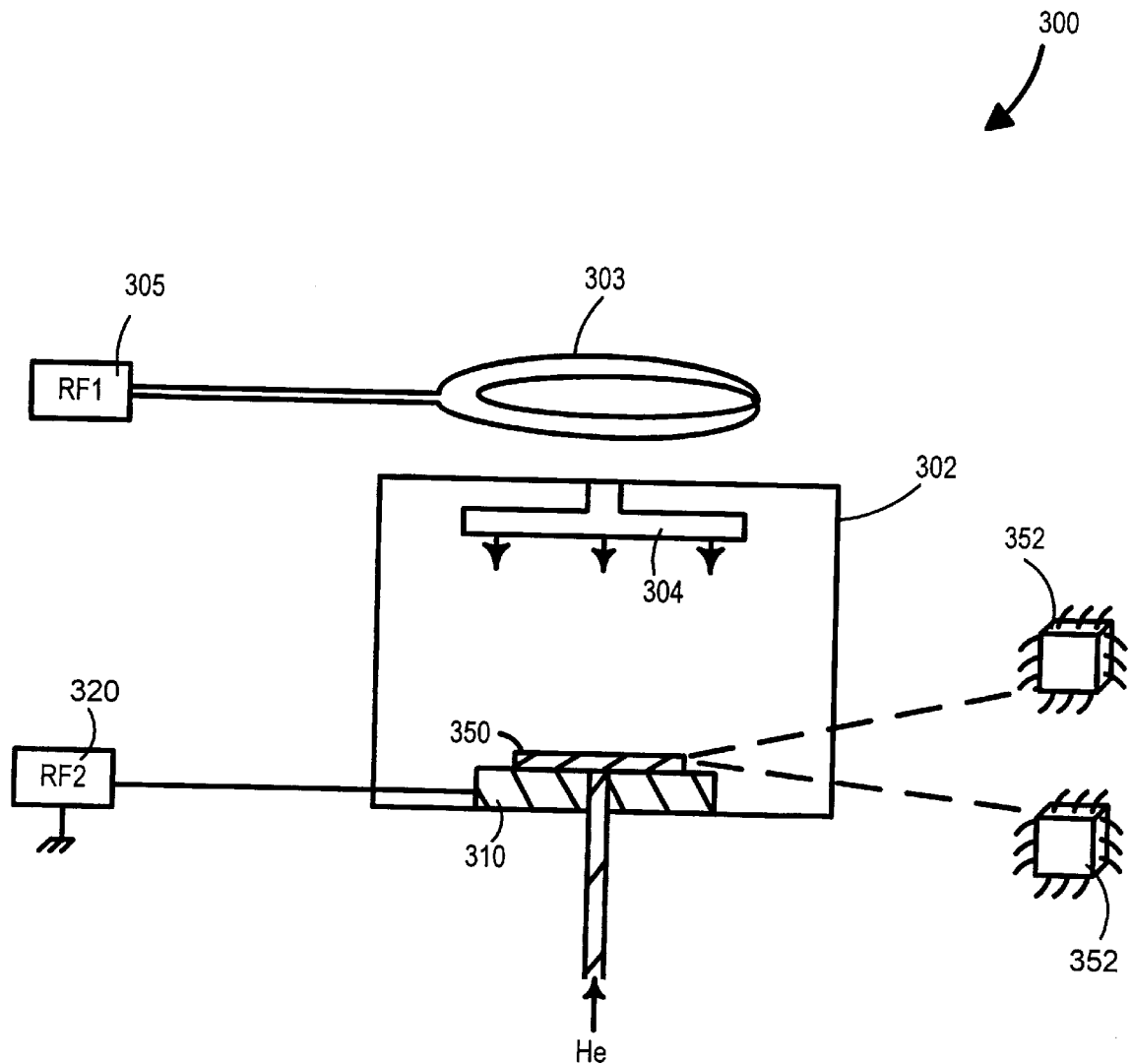
Fig.4 illustrates a simplified schematic of the TCP™ 9600 SE plasma reactor, representing a suitable plasma processing system for use with the inventive microloading improvement technique.

In a preferred embodiment, the present invention is employed in a TCP™ 9600 SE plasma reactor, which is available from the aforementioned Lam Research Corporation, although, as mentioned above, any other conventional and suitable plasma processing systems may well be employed. FIG. 4 illustrates a simplified schematic of the TCP™ 9600 SE plasma reactor, including substrate 350 and integrated circuit chips 352, which are fabricated from dies cut from substrate 350 after the substrate is etched and processed in conventional post-etch steps. Referring to FIG. 4, a substrate reactor 300 includes a plasma processing chamber 302. Above chamber 302, there is disposed an electrode 303, which is implemented by a coil in the example of FIG. 4. Coil 303 is energized by a top power supply 305 (in the form of an RF generator) via a matching network (not shown in FIG. 4).

Within chamber 302, there is provided a shower head 304, which preferably includes a plurality of holes for releasing gaseous source materials, e.g., the etchant source gases, into the RF-induced plasma region between itself and a substrate 350. The gaseous source materials may also be released from ports built into the walls of the chamber itself. Substrate 350 is introduced into chamber 302 and disposed on a chuck 310, which acts as a second electrode and is preferably biased by a bottom power supply 320 (also typically a radio frequency generator that is coupled to the second electrode via a matching network).

Helium cooling gas is introduced under pressure (e.g., about 5–10 Torr in one embodiment) between chuck 310 and substrate 350 to act as a heat transfer medium for accurately controlling the substrate's temperature during processing to ensure uniform and repeatable etching results. During plasma etching, the pressure within chamber 302 is preferably kept low, e.g., between about 2–60 mTorr in one embodiment. A plurality of heaters (omitted from FIG. 4 to simplify the illustration) may be provided to maintain a suitable chamber temperature for etching (e.g., about 40–80° C. in one embodiment). To provide a path to ground, the chamber wall of chamber 302 may be grounded.

Figure 5:
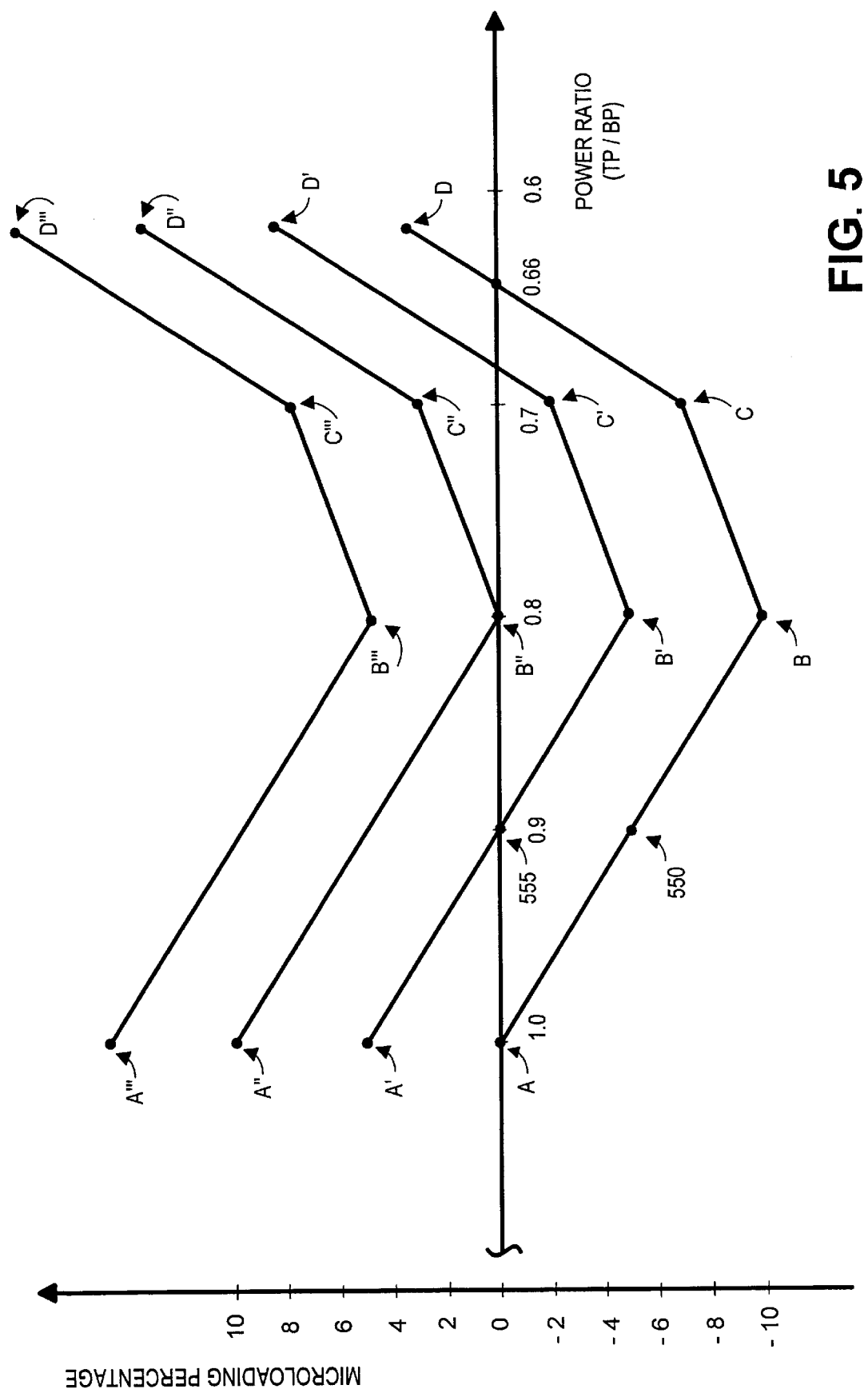
FIG. 5 illustrates, in accordance with one embodiment of the invention, a set of curves representing the plot of power ratios versus microloading percentages for exemplary metallization etches for different etch geometries using a first etchant.

FIG. 5 illustrates, in accordance with one aspect of the invention, a set of curves representing the plots of power ratios versus microloading percentages for exemplary metallization etches of substrates having different etch geometries. With reference to FIG. 5, there are shown curves A-D, A'-D', A"-D", A'"-D'", representing the data sets that correlate the power ratios (X-axis) with microloading percentages (Y-axis) for various geometries or design rule dimensions. To clarify, geometries or design rule dimensions determine the minimum width of the etched trenches. In the plot of FIG. 5, the chemistry employed is conventional a $BCl_3/Cl_2/N_2$ etchant for etching through an aluminum-containing metallization layer although the invention is not limited to any particular etchant.

With respect to curve A-D, the geometry is about 0.8 micron. For the described embodiment, the flow rate of $BCl_3$ is about 18 standard cubic centimeters per minute (sccm), the flow rate of $Cl_2$ is about 80 sccm, and the flow rate of $N_2$ is about 12 sccm. The etch is performed under a pressure condition of about 15 mTorr, a chamber temperature of about 70° C., and a bottom electrode temperature of about 50° C. in the aforementioned TCP™9600SE plasma etch system. Curves A'-D', A"-D" and A'"-D'" represent the expected data sets for the same etch, albeit on substrates having increasingly smaller etch geometries. As mentioned earlier, the curves are offset in the +Y direction since there is a trend toward natural (positive) microloading with increasingly smaller etch geometries.

For the etches of FIG. 5, the top power is maintained at a constant 250 watts (W) while the bottom power is varied to illustrate the discovery of the effect of the power ratio upon the microloading. Between data points A-B, the power ratio changes from 1.0 to 0.8. In this regime, the microloading becomes more negative, i.e., increasingly reverse microloading, with decreasing power ratios. While not wishing to be bound by theory, it is believed that as the bottom (or bias) power increases, reactive ions are accelerated toward the bottom of the narrow trenches, which result in a higher density of reactive ions in the narrow trenches. At the same time, it is believed that the accelerating ions also sputter off the photoresist material of the photoresist mask to create a layer of inhibiting polymer in the open field regions. Less inhibiting polymer may be deposited in the narrow trenches since the narrow trenches tend to restrict the freedom with which chemicals can circulate. Since more inhibiting polymer may be deposited in the open field regions compared to the amount of inhibiting polymer deposited in the narrow trenches, the etch rate in the open field region may be slower relative to that in the narrow trenches, giving rise to the increasingly reverse microloading situation seen in segment A-B of curve A-D.

Below a certain power ratio, e.g., when the bottom power increases beyond a certain point, the trend toward increasing reverse microloading changes. In segment B-D of curve A-D, the microloading becomes increasingly positive as the bottom power is increased (and the power ratio is decreased). While not wishing to be bound by theory, it is believed that when the bottom (bias) power increases beyond a certain point, the accelerating ions begin to sputter off the layer of deposited inhibiting polymer in the open field regions, negating the effect of the inhibiting polymer and increases the etch rate of the open field regions. As shown in FIG. 5, at about a power ratio of about 0.66, the microloading is about zero, i.e., the etch rates in the narrow trenches and the open field regions are equalized. Below this power ratio, the curve A-D is in the natural (positive) microloading regime.

In accordance with one aspect of the invention, the invention pertains to the use of the predetermined microloading percentage v. power ratio data sets or curves of FIG. 5 to permit a process engineer to quickly ascertain the power ratio required to achieve the desired microloading level for a particular etch geometries. For example, if the desired microloading percentage is zero, the process engineer may employ the curve A-D to quickly ascertain that he needs to adjust the power ratio to reach a power ratio of about 0.66 (e.g., by increasing the bottom power setting). In that region, the microloading percentage should be around zero. Accordingly, the time-consuming trial-and-error approach of the prior art is advantageously avoided.

If the process window prevents the engineer from increasing the bottom power to achieve the desired power ratio (e.g., due to substrate damage and/or selectivity concerns), the top power may be decreased to arrive at the same power ratio since the important variable has been found by the inventor to be the power ratio, not the power setting of any one power supply (although a sufficient top power level should of course be maintained to sustain the plasma and to achieve a minimum level of ion density).

In some cases, there may not be a predetermined data set for a particular geometry. By way of example, plasma processing systems are typically very expensive and a user may not have the resources to explore every possible etch geometries in advance. In this case, the invention advantageously provides a technique whereby the engineer can extrapolate the needed data set from existing pre-determined data sets pertaining to geometries that are close to the particular geometry under consideration. In accordance with one aspect of the present invention, it is recognized that decreasing the etch geometries tends to increase the tendency toward natural (positive) microloading. Conversely, increasing the etch geometries may reduce the degree of natural (positive) microloading.

While not wishing to be bound by theory, it is believed that these phenomenon occur because the small etch geometries makes it more difficult for reactive ion species to circulate toward the bottom of the narrow trenches, and it is more difficult for etch byproducts to be evacuated from the narrow trenches. The result is a lower level of reactive species at the bottom of the narrow trenches, which leads to a lower etch rate in the narrow trenches relative to the etch rate in the open field regions.

Accordingly, it is expected that the entire curve A-D would shift upward if the etch geometries decreases. Using this knowledge, the engineer may be able to extrapolate a data set from an existing one if the etch geometries decrease. The data set for the small etch geometries is represented by curve A'-D' in FIG. 5. Alternatively, if the data set for curve A"-D" exists (and its associated etch geometries is known), it is possible to extrapolate downward to obtain the data set for a substrate having slightly larger etch geometries. As a further alternative, the data sets for existing curves A"-D" and A'-D' may both be employed to extrapolate (e.g., linearly in one example) the data set for etch geometries that falls between the etch geometries associated with curve A"-D" and the etch geometries associated with curve A-D (e.g., thereby deriving the data set representing curve A'-D'). Once the extrapolated data set is obtained, the engineer can again employ it to find the appropriate power ratio that would yield the acceptable level of microloading without having to perform numerous trial etches (as would be necessary in the prior art).

Along the same line, it may be possible to extrapolate only a single data point if the estimated shift in the microloading percentage can be estimated (as the etch geometries moves from one associated with a known data set with the etch geometries under consideration). By way of example, assume that a user wishes to obtain 0% microloading percentage with an etch geometry of 0.3 micron. Also assume that the only existing data set is one for the 0.8 micron geometry, which is shown as curve A-D in FIG. 5. With reference to FIG. 5, for example, if it is estimated that the microloading percentage may shift by about 5% toward natural microloading when the etch geometries moves from 0.8 micron to 0.3 micron, the engineer may be able to utilize this knowledge to ascertain point 550 on the A-D curve (existing data set associated with 0.8 micron etch geometries) since this point on the A-D curve is about 5% below the desired 0% microloading percentage. By projecting upward from this point, the engineer would be able to ascertain point 555, which corresponds to a power ratio of about 0.9. The engineer may then set the bottom power and/or the top power settings to approximately obtain desired microloading percentage.

Another advantage that flows from the described technique relates to the simplicity with which microloading problems can be addressed. If the process engineer has achieved the desired etch results with respect to parameters other than microloading (e.g., with respect to etch rate, etch uniformity, selectivity to photoresist, and/or the like), microloading can be addressed by adjusting only one or at most two knobs: the bottom power knob and/or the top power knob. In fact, as mentioned before, the total power does not even have to be changed since the invention advantageously recognizes that it is the power ratio that influences the microloading, and there is no need to increase or decrease the total power to change the microloading percentage.

In some cases, it may be possible to determine from the predetermined data sets that the desired level of microloading is not possible for a particular etch geometries/etchant combination irrespective of the power ratio. With reference to FIG. 5, for example, if the process limits the power ratio to the range between 0.6 and 1 (due to e.g., substrate damage and/or selectivity concerns), no change in the power ratio can cause the etch associated with curve A'''-D''' to ever achieve a microloading percentage of 0. In this case, it is possible to quickly determine, upon reviewing the data sets associated with curve A'''-D''' and without the expenses and time delay associated with the prior art trial-and-error technique, that the etchant should be changed if the desired microloading is to be achieved.

In accordance with one aspect of the present invention, it is recognized that the use of an etchant with a greater inhibiting characteristic (e.g., containing more inhibitor-causing chemicals) tends to increase the tendency toward reverse microloading. Accordingly, it may be that an etchant with a greater inhibiting characteristic is required if the substrate having the geometries associated with curve A'''-D''' is to have the desired microloading level of zero.

Figure 6:
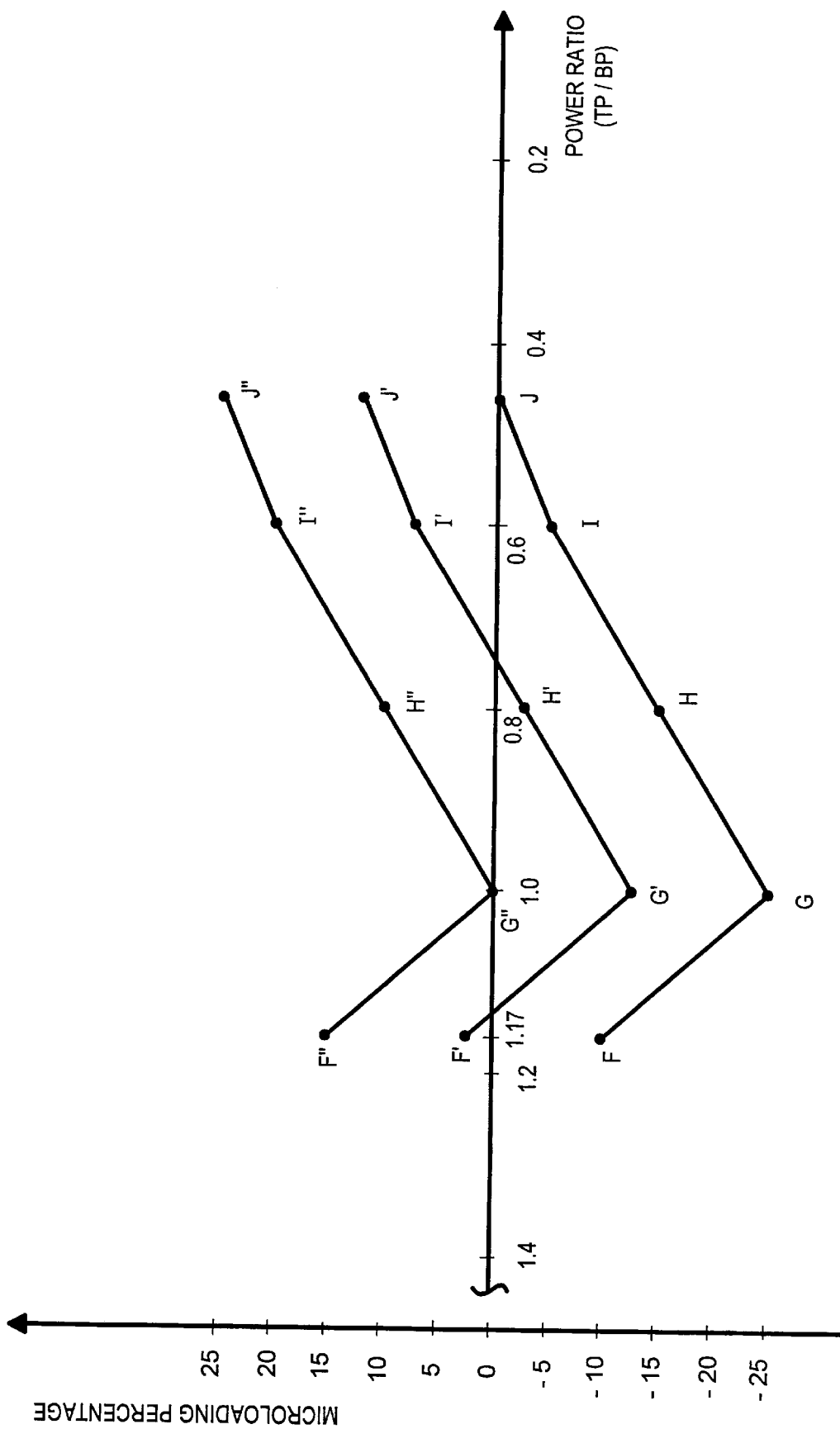
FIG. 6 illustrates, in accordance with one embodiment of the invention, a set of curves representing the plot of power ratios versus microloading percentages for other exemplary metallization etches for different etch geometries using a second etchant.

FIG. 6 illustrates, in accordance with one aspect of the invention, a set of curves representing the plots of power ratios versus microloading percentages for exemplary metallization etches for various etch geometries. The etches of FIG. 6 employ an etchant having greater inhibiting characteristics than the etchant associated with FIG. 5. With reference to FIG. 6, there are shown curves F-J, F'-J', F"-J" representing the data sets that correlate the power ratios (X-axis) with microloading percentages (Y-axis) for various geometries or design rule dimensions. In the plot of FIG. 6, the chemistry employed is $HCl/Cl_2/CHF_3$, representing an etchant having a greater inhibiting characteristic than the $BCl_3/Cl_2/N_2$ etchant employed in the etches of FIG. 5. Again, although the etchant $HCl/Cl_2/CHF_3$ is employed to facilitate discussion, it should be borne in mind that the invention is not limited to any particular etchant.

With respect to curve F-J, the geometry is about 0.8 micron. For the described embodiment, the flow rate of HCl is about 18 standard cubic centimeters per minute (sccm), the flow rate of $Cl_2$ is about 80 sccm, and the flow rate of $CHF_3$ is about 12 sccm. The etch is again performed under a pressure condition of about 15 mTorr, a chamber temperature of about 70° C., and a bottom electrode temperature of about 50° C. in the aforementioned TCP™9600SE plasma etch system. Curves F'-J' and F"-J" represent the expected data sets for the same etch, albeit on substrates having increasingly smaller etch geometries. As mentioned earlier, the curves are offset in the +Y direction since there is a trend toward natural (positive) microloading with increasingly smaller etch geometries.

For the etches of FIG. 6, the top power is maintained at a constant 250 watts (W) while the bottom power is varied to illustrate the discovery of the effect of the power ratio upon the microloading. Between data points F-G, the power ratio changes from 1.17 to 1.0. In this regime, the microloading becomes more negative, i.e., increasingly reverse microloading, with decreasing power ratios. While not wishing to be bound by theory, it is believed that the reasons for the increase in the observed reverse microloading is substantially similar to the reasons offered in connection with segment A-B of curve A-D of FIG. 5.

Below a certain power ratio, e.g., when the bottom power increases beyond a certain point, the trend toward increasing reverse microloading changes. In segment G-J of curve F-J, the microloading becomes increasingly positive as the bottom power is increased (and the power ratio is decreased). While not wishing to be bound by theory, it is believed that the reasons for the increase in the observed natural microloading is substantially similar to the reasons offered in connection with segment B-D of curve A-D of FIG. 5. With curve F-J, the process engineer can again employ the curve to quickly ascertain the required power ratio for the 0.8 micron geometry to attain a desired microloading percentage, thereby eliminating the need to perform the numerous trial etches (as would be done in the prior art). If necessary, extrapolation may be done on the curve of FIG. 6 to obtain the desired data set/data point for other etch geometries.

In one embodiment, the inventive technique involves using the data sets pertaining to one etchant to ascertain whether the desired microloading level can be attained with the current combination of etchant/etch geometries. If not, an alternative etchant should be employed to facilitate the attainment of the desired microloading level. If it is found that an alternative etchant is required, the resultant change in the etchant may be viewed as a "coarse" adjustment. Thereafter, the predefined data sets associated with the new etchant may be employed to determine the exact power ratio required to achieve the desired microloading percentage.

This latter determination may be viewed as a "fine" adjustment to permit the design engineer to more finely tune the etch process in view of the desired microloading level.

In another embodiment, the invention permits the engineer to compare data sets for different etchants to efficiently choose the most advantageous etchant(s) for a particular microloading percentage in view of the permissible power ratio window. Suppose the data sets pertaining to two different etchants both suggest that the desired microloading percentage may be achieved within the permissible power ratio window, it may be able to utilize this knowledge to select the more advantageous etchant of the two. By way of example, the data may enable the selection of, for example, the etchant that is less expensive, has a higher etch rate, a higher etch uniformity, or better selectivity to photoresist, contributes less to polymer formation, and/or the like.

In accordance with one particularly advantageous embodiment of the present invention, the disclosed microloading improvement technique may be implemented, either wholly or in part, as a computer program. As an example, the data sets may be stored in the computer memory and the decisions pertaining to alternative etchant(s) and/or appropriate power ratio may be automatically provided to the process engineer by computer-implemented instructions programmed in accordance with the technique disclosed herein. The computer may also extrapolate, using known extrapolation techniques, to obtain the extrapolated data set/data point from existing data sets if the etch geometries changes.

If a large enough data set for various etchants/etch geometries are provided, the process engineer, upon executing the program, may be able to obtain almost instantaneously the list of useable etchants for a particular etch geometries/microloading combination, the most advantageous etchant (determined in accordance with some pre-programmed selection criteria), the most appropriate power ratio for each etchant, and/or the like. If desired, the computer may be instructed to automatically adjust the power settings of the plasma processing system to conform to the appropriate power ratio (and the constraints on the total power, if appropriate).

The implementation of the steps of the disclosed technique in a computer program, although well within the skills of those skilled in the art of programming in light of this disclosure, nevertheless offers many nonobvious benefits to the process engineers. First, even if the prior art method can be implemented in a computer, its trial-and-error approach still requires many etches to come up with the appropriate process parameters for a desired level of microloading percentage. As can be appreciated by those skilled, little benefit is gained by computerizing the prior art trial-and-error approach since the etches themselves are still time consuming and costly to perform even if the generation of the combinations for the trial etches can be computerized.

In contrast, the disclosed inventive etchant/power ratio selection techniques make it possible to ascertain, using the pre-determined data sets and the disclosed extrapolation methods (if required), the appropriate etchant and/or appropriate power ratio for particular etch geometries and a desired level of microloading performance without requiring, in some cases, even a single trial etch. Because the costly and time-consuming trial etches are no longer the bottleneck, the inventive microloading improvement techniques offer productivity and time/cost saving improvements that are simply not possible with the prior art trial-and-error approach, computerized or not.

While this invention has been described in terms of several preferred embodiments, there are alterations, permutations, and equivalents which fall within the scope of this invention. By way of example, although the disclosure refers to the etching of the metallization layer, it should be appreciated by those skilled that the inventive microloading improvement technique may also employed when etching through any layer, e.g., oxide, polysilicon, and the like. As a further example, although the correlation is made only for power ratios with combinations of etch geometries/etchant, other correlations may also be made. By way of example, multi-dimensional tables may be predetermined in which power ratios may be correlated with combinations of etch geometries, etchants, ion densities, pressures, temperatures, and/or any other process parameters. These multi-dimensional tables (and/or their graphical counterparts) may then be employed to simplify the determination of the appropriate power ratios and/or other process parameter variations to achieve the desired microloading percentage. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for improving microloading of a substrate to be etched in a plasma processing chamber, said substrate being etched with a first etchant to form trenches having a given trench width, the plasma processing chamber having a first power supply configured to energize a first electrode of said chamber and a second power supply configured to energize a second electrode of said chamber, said method comprising:

obtaining a first data set among a plurality of data sets that correlate power ratios of said first power supply and said second power supply with microloading percentages for said first etchant for different trench widths, said first data set correlating said power ratios with said microloading percentages for a first trench width, said first trench width approximating said given trench width as closely as possible;

ascertaining a power ratio of settings to be applied to said first and second power supplies that yields a desired level of microloading;

determining if said ascertained power ratio is in said first data set;

if said power ratio is in said first data set, applying a first setting from said first data set to said first power supply and said second power supply in accordance with said ascertained power ratio to achieve said desired level of microloading in etching said substrate with said first etchant; and if said power ratio is not in said first data set, employing a second etchant different from said first etchant to etch said substrate, said second etchant having a greater inhibiting characteristic than said first etchant.

2. The method of claim 1 wherein said plurality of data sets represent a table of values.

3. The method of claim 1 wherein said plurality of data sets represent pre-determined as a set of curves of said power ratios versus said microloading percentages for said first etchant for said different trench widths.

4. The method of claim 1 wherein said setting said first setting further includes setting a second setting of a second one of said first power supply and said second power supply to keep a total power level of said chamber substantially constant.

5. The method of claim 1 wherein said trenches represent trenches in a metallization layer.

6. The method of claim 1 wherein said plasma processing chamber is an inductively coupled plasma processing chamber.

7. The method of claim 1 wherein said first etchant includes $Cl_2$ and $BCl_3$ and said second etchant includes $Cl_2$ and $CHF_3$.

8. The method of claim 1 wherein said substrate is employed to form integrated circuit dies.

9. A method for improving microloading of a substrate to be etched in a plasma processing chamber, said substrate being etched with a first etchant to form trenches having a given trench width, the plasma processing chamber having a first power supply configured to energize a first electrode of said chamber and a second power supply configured to energize a second electrode of said chamber, said method comprising:

obtaining a first data set among a plurality of data sets that correlate power ratios of said first power supply and said second power supply with microloading percentages for said first etchant for different trench widths, said first data set correlating said power ratios with said microloading percentages for a first trench width, said first trench width approximating said given trench width as closely as possible;

extrapolating a second data set from said first data set, said second data set correlating said power ratios with said microloading percentages for said given trench width;

ascertaining a power ratio from said second data set of settings to be applied to said first and second power supplies that yields a desired level of microloading; and applying a first setting from said second data set to said first power supply and said second power supply in accordance with said ascertained power ratio to achieve said desired level of microloading.

10. The method of claim 9 wherein said plurality of data sets represent a table of values.

11. The method of claim 9 wherein said plurality of data sets represent a set of pre-determined curves of said power ratios versus said microloading percentages for said first etchant for said different trench widths.

12. The method of claim 9 wherein said first trench width represents a trench width that is larger than said given trench width, said second data set represents an extrapolated curve that is substantially similar in shape to a first curve representing said first data set, said extrapolated curve being offset from said first curve in the +Y direction.

13. The method of claim 9 wherein said setting said first setting further includes setting a second setting of a second one of said first power supply and said second power supply to keep a total power level of said chamber substantially constant.

14. The method of claim 9 wherein said trenches represent trenches in a metallization layer.

15. The method of claim 9 wherein said plasma processing chamber is an inductively coupled plasma processing chamber.

16. The method of claim 9 wherein said substrate is employed to form integrated circuit dies.

17. A method for improving microloading of a substrate to be etched in a plasma processing chamber, said substrate being etched with a first etchant to form trenches having a given trench width, the plasma processing chamber having a first power supply configured to energize a first electrode of said chamber and a second power supply configured to energize a second electrode of said chamber, said method comprising:

obtaining a first data set among a plurality of data sets that correlate power ratios of said first power supply and said second power supply with microloading percentages for said first etchant for different trench widths, said first data set correlating said power ratios with said microloading percentages for a first trench width, said first trench width approximating said given trench width as closely as possible;

estimating a change in microloading percentage between said first trench width and said given trench width;

ascertaining a first data point of said first data set, said first data point correlating to a first microloading level with a first power ratio, said first microloading level representing a desired level loading plus said change in microloading percentage; and applying a first setting from said first data set to said first power supply and said second power supply in accordance with said ascertained first power ratio to achieve said desired level of microloading.

18. The method of claim 17 wherein said plurality of data sets represent a set of curves of said power ratios versus said microloading percentages for said first etchant for said different trench widths.

19. The method of claim 17 wherein said setting said first setting further includes setting a second setting of a second one of said first power supply and said second power supply to keep a total power level of said chamber substantially constant.

20. The method of claim 17 wherein said plasma processing chamber is an inductively coupled plasma processing chamber.

* * * * *